United States Patent
Johnson et al.

(10) Patent No.: US 9,837,935 B2
(45) Date of Patent: Dec. 5, 2017

(54) ALL-SILICON ELECTRODE CAPACITIVE TRANSDUCER ON A GLASS SUBSTRATE

(71) Applicant: Honeywell International Inc., Morristown, NJ (US)

(72) Inventors: Burgess R. Johnson, Bloomington, MN (US); Ryan Supino, Loretto, MN (US)

(73) Assignee: Honeywell International Inc., Morris Plains, NJ (US)

( * ) Notice: Subject to any disclaimer, the term of this patent is extended or adjusted under 35 U.S.C. 154(b) by 1028 days.

(21) Appl. No.: 14/066,168

(22) Filed: Oct. 29, 2013

(65) Prior Publication Data
US 2015/0115770 A1 Apr. 30, 2015

(51) Int. Cl.
*H02N 1/08* (2006.01)
*G01L 9/00* (2006.01)
*B32B 37/02* (2006.01)
*B32B 38/10* (2006.01)
*B81B 3/00* (2006.01)

(52) U.S. Cl.
CPC ............ *H02N 1/08* (2013.01); *B32B 37/02* (2013.01); *B32B 38/10* (2013.01); *B81B 3/0086* (2013.01); *B32B 2307/202* (2013.01); *B32B 2310/0418* (2013.01); *B32B 2457/16* (2013.01)

(58) Field of Classification Search
CPC .......... G01P 15/125; G01L 1/142; G01L 1/48
See application file for complete search history.

(56) References Cited

U.S. PATENT DOCUMENTS

| 4,467,394 A | 8/1984 | Grantham et al. |
| 5,025,346 A | 6/1991 | Tang et al. |

(Continued)

FOREIGN PATENT DOCUMENTS

| CN | 1217470 | 5/1999 |
| EP | 0090845 | 6/1987 |
| WO | 2012108283 | 8/2012 |

OTHER PUBLICATIONS

European Patent Office, Extended European Search Report from EP Application No. 14187542.7 dated Mar. 27, 2015, from Foreign Counterpart of U.S. Appl. No. 14/066,168, dated Mar. 27, 2015, pp. 1-6, Published in: EP.

*Primary Examiner* — Lisa Caputo
*Assistant Examiner* — Tran M Tran
(74) *Attorney, Agent, or Firm* — Fogg & Powers LLC

(57) ABSTRACT

An all-silicon electrode capacitive transducer comprising: a movable silicon microstructure coupled to a glass substrate, the movable silicon microstructure having a movable silicon electrode, the glass substrate having a top surface and at least one recess, the movable silicon electrode having a first flat surface parallel to a plane of the top surface of the glass substrate, the movable silicon electrode having a first electronic work function; and a stationary silicon electrode coupled to a glass substrate, the stationary silicon electrode located adjacent to the movable silicon electrode, the stationary silicon electrode configured to sense or actuate displacement of the movable silicon microstructure, wherein the stationary silicon electrode has a second flat surface parallel to the first flat surface, the stationary silicon electrode having a second electronic work function equal to the first electronic work function.

13 Claims, 11 Drawing Sheets

(56) References Cited

U.S. PATENT DOCUMENTS

| | | | | |
|---|---|---|---|---|
| 5,095,752 | A * | 3/1992 | Suzuki | G01P 15/0802 361/280 |
| 5,243,861 | A * | 9/1993 | Kloeck | B81B 7/007 257/415 |
| 5,260,596 | A * | 11/1993 | Dunn | H01L 27/20 257/414 |
| 5,349,855 | A | 9/1994 | Bernstein et al. | |
| 5,367,429 | A * | 11/1994 | Tsuchitani | B81B 3/0008 361/280 |
| 5,392,651 | A * | 2/1995 | Suzuki | G01P 15/0802 438/456 |
| 5,417,312 | A * | 5/1995 | Tsuchitani | G01P 1/003 188/181 A |
| 5,488,869 | A * | 2/1996 | Renaud | G01L 9/0073 73/718 |
| 5,668,033 | A * | 9/1997 | Ohara | B81C 1/00301 148/DIG. 12 |
| 5,753,817 | A | 5/1998 | Park et al. | |
| 5,808,210 | A * | 9/1998 | Herb | G01L 9/002 73/704 |
| 5,994,204 | A * | 11/1999 | Young | H01L 21/2007 257/E21.122 |
| 6,067,858 | A * | 5/2000 | Clark | G01C 19/5719 73/504.16 |
| 6,230,563 | B1 * | 5/2001 | Clark | G01C 19/5719 73/504.04 |
| 6,230,564 | B1 * | 5/2001 | Matsunaga | G01P 15/0802 73/1.38 |
| 6,271,620 | B1 | 8/2001 | Ladabaum | |
| 6,341,527 | B1 * | 1/2002 | Ishikura | G01L 9/0075 73/718 |
| 6,465,854 | B1 * | 10/2002 | Muenzel | B81C 1/00269 257/415 |
| 6,536,281 | B2 * | 3/2003 | Abe | B81B 7/007 73/504.16 |
| 6,566,742 | B1 * | 5/2003 | Matsumoto | G01P 15/125 257/678 |
| 6,571,445 | B2 | 6/2003 | Ladabaum | |
| 6,582,985 | B2 * | 6/2003 | Cabuz | B81C 1/0015 257/E27.111 |
| 6,784,593 | B2 * | 8/2004 | Hartwell | H02N 1/006 257/415 |
| 6,930,368 | B2 * | 8/2005 | Hartwell | B81B 7/0041 257/417 |
| 7,036,373 | B2 * | 5/2006 | Johnson | G01C 19/5719 73/504.02 |
| 7,172,917 | B2 * | 2/2007 | Partridge | H01G 5/16 438/50 |
| 7,223,624 | B2 * | 5/2007 | Wu | B60C 23/0408 438/52 |
| 7,535,096 | B2 * | 5/2009 | Tamura | G01L 9/0073 257/704 |
| 7,539,003 | B2 | 5/2009 | Ray et al. | |
| 7,582,940 | B2 * | 9/2009 | Ohguro | B81C 1/00333 257/415 |
| 7,808,061 | B2 * | 10/2010 | Hartwell | B81B 3/0062 257/417 |
| 8,186,221 | B2 | 5/2012 | Lin et al. | |
| 8,464,585 | B2 | 6/2013 | Raman et al. | |
| 8,470,628 | B2 * | 6/2013 | Guillorn | H01H 1/0094 257/414 |
| 8,511,168 | B2 * | 8/2013 | Zinober | B81B 7/0025 361/283.1 |
| 8,742,872 | B2 * | 6/2014 | Iwasaki | H03H 9/1057 257/415 |
| 8,993,907 | B2 * | 3/2015 | Guillorn | H01H 1/0094 200/181 |
| 9,171,964 | B2 * | 10/2015 | Horning | B81B 7/0038 |
| 9,377,484 | B2 * | 6/2016 | Kamisuki | G01P 15/125 |
| 2003/0084722 | A1 | 5/2003 | Kim et al. | |
| 2004/0073137 | A1 | 4/2004 | Lloyd et al. | |
| 2007/0161896 | A1 | 7/2007 | Adachi et al. | |
| 2012/0048019 | A1 * | 3/2012 | Zhou | G01P 15/125 73/514.32 |
| 2012/0256520 | A1 | 10/2012 | Torashima et al. | |
| 2013/0001719 | A1 | 1/2013 | Riva et al. | |

* cited by examiner

ALL-SILICON ELECTRODE CAPACITIVE TRANSDUCER ON A GLASS SUBSTRATE

BACKGROUND

Capacitive transducers are widely used for electrostatic sensing of displacement and to create electrostatic forces that produce displacement in MEMS microstructures. These transducers consist of at least two electrodes separated by one or more narrow gaps (typically 1-20 microns). When a voltage difference is applied between the two electrodes, a change in position of the electrodes induces a change in the electrical charge on the electrodes, which is detected by external electronics. Typically, at least one of the electrodes is a movable microstructure whose displacement or velocity indicates some physical quantity to be sensed, such as acceleration, rotation, pressure, etc.

A capacitive transducer can also act as an actuator for a movable microstructure, by producing electrostatic forces on the electrodes when a voltage difference is applied between the electrodes.

SUMMARY

One embodiment for an all-silicon electrode capacitive transducer is provided. The transducer comprises a movable silicon microstructure coupled to a glass substrate, the movable silicon microstructure having a movable silicon electrode. The glass substrate has a top surface and at least one recess. The movable silicon electrode has a first flat surface parallel to a plane of the top surface of the glass substrate. The movable silicon microstructure and movable silicon electrode have a first electronic work function. A stationary silicon electrode is bonded to the glass substrate. The stationary silicon electrode is placed adjacent to the movable silicon electrode, and is configured to sense or actuate displacement of the movable silicon microstructure. The stationary silicon electrode has a second flat surface parallel to the first flat surface. The stationary silicon electrode has a second electronic work function equal to the first electronic work function of the movable silicon microstructure and movable silicon electrode.

DRAWINGS

Understanding that the drawings depict only exemplary embodiments and are not therefore to be considered limiting in scope, the exemplary embodiments will be described with additional specificity and detail through the use of the accompanying drawings, in which.

Figure 1:
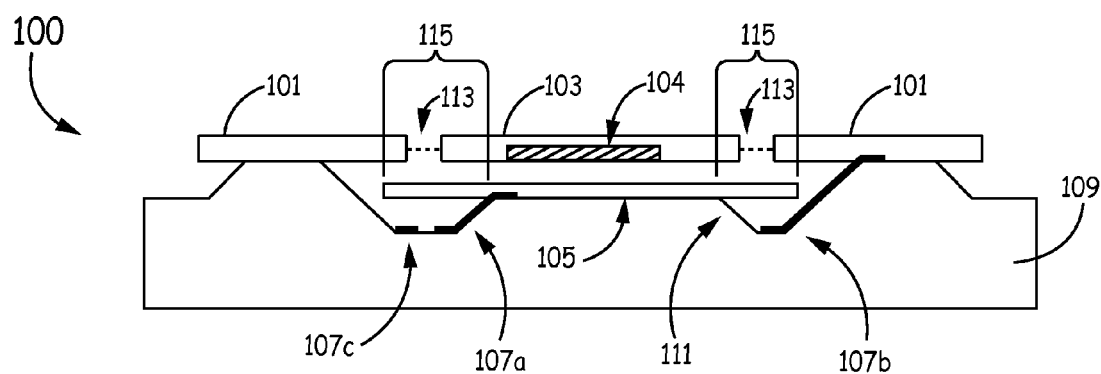
FIG. 1 illustrates one embodiment of an all-silicon electrode capacitive transducer.

In accordance with common practice, the various described features are not drawn to scale but are drawn to emphasize specific features relevant to the exemplary embodiments.

DETAILED DESCRIPTION

In the following detailed description, reference is made to the accompanying drawings that form a part hereof, and in which is shown by way of illustration specific illustrative embodiments. However, it is to be understood that other embodiments may be utilized and that logical, mechanical, and electrical changes may be made. Furthermore, the method presented in the drawing figures and the specification is not to be construed as limiting the order in which the individual steps may be performed. The following detailed description is, therefore, not to be taken in a limiting sense.

For precise and robust vertical sensing and actuation of a movable silicon microstructure, and for electrical shielding, it is desirable to replace stationary metal electrodes with stationary silicon electrodes to mitigate contact potential difference (CPD) between the stationary and movable electrodes. By replacing the metal electrode with a silicon electrode, the electronic work function of the silicon electrode is approximately matched to the electronic work function of the movable silicon electrode, thus reducing or eliminating CPD between the two electrodes.

To achieve precise sensing or actuation, it is important to have precise control of the voltages on the electrodes. This is difficult if the electrodes are made of different materials having different electronic work functions. In that case, there is an effective built-in voltage difference between the electrodes equal to the difference between the work functions of the electrode materials. This built-in voltage difference is known as the contact potential difference (CPD). The CPD induces charges on the electrodes that can produce an erroneous sensor signal in the external electronics, and/or an undesired electrostatic actuator force. The precise value of the CPD varies according to the compositions of the electrode surfaces, which can vary with time due to variations in temperature, chemical reactions with gases in the capacitor gap, surface contaminants, material structure, etc. Thus, the CPD can degrade the precision of a sensor or actuator consisting of a capacitive transducer.

FIG. 1 illustrates an exemplary all-silicon electrode vertical capacitive transducer on a glass substrate 100. The all-silicon electrode capacitive transducer 100 includes anchored silicon 101, movable silicon microstructure 103, stationary silicon electrode 105, and metal electrical leads 107. Stationary silicon electrode 105 is a highly doped epitaxial silicon electrode bonded to a recess in glass substrate 109.

In one embodiment, glass substrate 109 has two recesses, a first recess and a second recess deeper than the first. Stationary silicon electrode 105 is bonded to the first recess. Metal electrical leads 107*a* and 107*b* are patterned along the glass substrate such that one of the metal electrical leads 107*a* is placed along the bottom of the second recess up to the first recess such that the metal electrical lead 107*a* makes electrical connection to the stationary silicon electrode 105. Movable silicon electrode 104 is electrically coupled to stationary silicon 101. Metal electrical lead 107*b* is placed along the bottom of the second recess up to a top surface of the glass substrate 109, such that the metal electrical lead 107*b* is coupled to anchored silicon 101. The metal electrodes 107*a* and 107*b* are positioned below the stationary silicon electrode 105 such that the movable silicon microstructure 103 is shielded by the stationary silicon electrode 105 from the metal electrical leads 107*a*, 107*b*, and other metal electrical leads including metal electrical lead 107*c*.

A stationary electrode on the glass substrate below the movable silicon microstructure is often necessary to shield the movable microstructure from electric fields produced by unwanted electric charges on the surface of the glass substrate, or by applied voltages in other parts of the device. A CPD between such a shield electrode and the movable microstructure can result in an erroneous sensor output or actuator force.

Using stationary silicon electrode 105 mitigates (e.g. reduces or eliminates) the CPD between the stationary silicon electrode 105 and the movable silicon microstructure 103, as compared to a vertical capacitive transducer having a metal electrode on a glass substrate and silicon movable microstructure.

The stationary silicon electrode 105 is configured to sense or actuate displacement of the movable silicon microstructure 103. In one embodiment, stationary silicon electrode 105 has overhangs 115 that extend beyond the glass recess to which the stationary silicon electrode 105 is bonded to the glass substrate 109. The density of stray charges on an insulating glass surface 111 can drift with time, producing erroneous sensor output signals if the electric fields produced by the stray charges extend to the movable silicon microstructure 103. In addition to eliminating the CPD between the silicon electrode 105 and the movable silicon microstructure 103, the silicon electrode 105 has an "overhang" 115 shielding the movable silicon microstructure 103 from the glass surface 111. The movable silicon microstructure 103 includes a movable silicon electrode 104 formed in the movable silicon microstructure 103. In one embodiment, movable silicon microstructure 103 is also the movable silicon electrode 104. In other embodiments, movable silicon electrode 104 comprises only a portion of movable silicon microstructure 103.

Anchored silicon 101 is bonded to glass substrate 109. The movable silicon microstructure 103 and anchored silicon 101 are connected by flexible silicon suspensions 113. The flexible silicon suspensions 113 are mechanically compliant, allowing the movable silicon microstructure 103 to move. The anchored silicon 101, movable silicon microstructure 103, and flexible silicon suspensions 113 are formed by photolithography and etching from the same piece of silicon. In one embodiment, the overhanging structures of the silicon electrode 105, and also anchored silicon 101, provide a shield that prevents electric field lines from glass surfaces 111 from reaching the movable silicon microstructure 103. The shield can also prevent electric field lines from metal electrical leads 107 on the glass from reaching the movable silicon microstructure 103. Metal electrical leads 107 are patterned on the glass substrate 109. Electrical leads 107 are coupled to the stationary silicon electrode 105, and the anchored silicon 101. In some embodiments, anchored silicon 101 is electrically conductive, and is coupled to movable silicon microstructure 103 and/or movable silicon electrode 104 via flexible silicon suspensions 113. One of the metal electrical leads 107 is coupled to carry an electrical signal from the stationary silicon electrode 105. Another metal electrical lead is coupled to carry an electrical signal from an electrode in anchored silicon 101, and another coupled to carry an electrical signal from movable silicon microstructure 104.

Figure 2A:
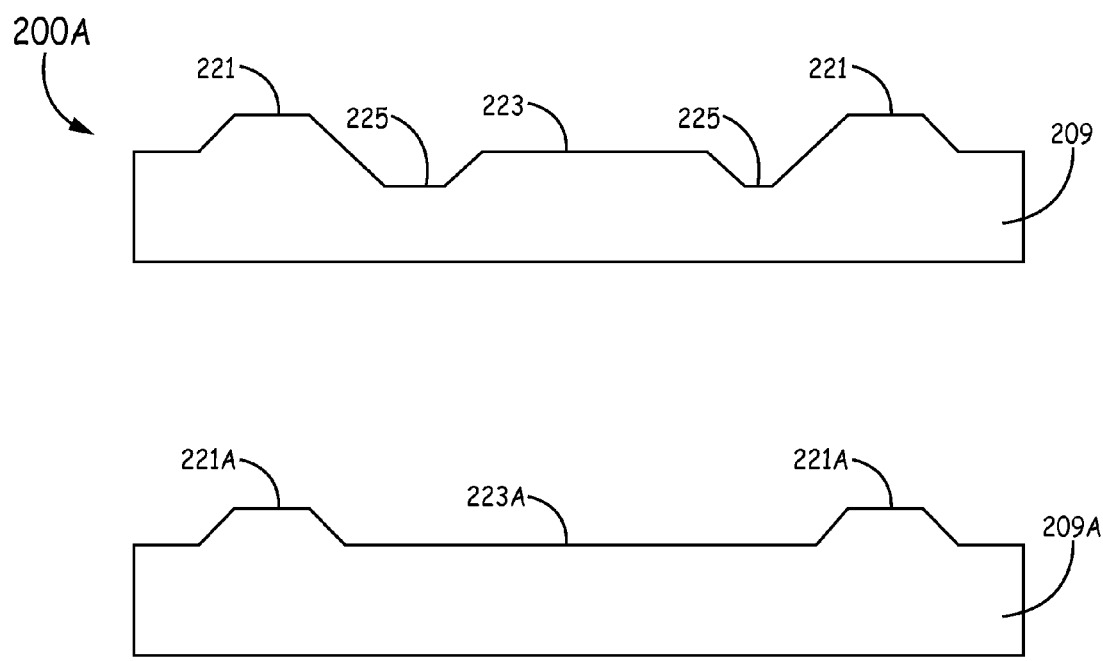
FIG. 2A illustrates one embodiment of recesses in a glass substrate as part of an exemplary manufacturing process for an all-silicon electrode capacitive transducer.

FIGS. 2A-2F illustrates an exemplary manufacturing process for an all-silicon electrode capacitive transducer according to one embodiment. The process is described below with reference to FIGS. 2A-2F. FIG. 2A illustrates a cross sectional view 200A of a glass substrate 209 with two sets of recesses, a set of first recesses 223 below a top surface 221, and a set of second recesses 225 deeper than the first recesses 223. In one embodiment, only one set of recesses 223A is etched into the glass substrate 209A, with the unetched glass substrate 209A forming mesas with top surface 221A.

Figure 2B:
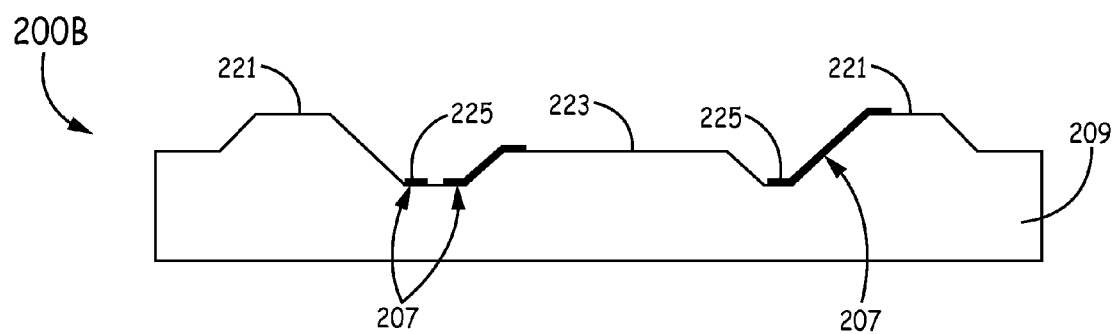
FIG. 2B illustrates one embodiment of metal leads placed on a glass substrate as part of an exemplary manufacturing process for an all-silicon electrode capacitive transducer.

FIG. 2B illustrates a cross sectional view 200B of the glass substrate 209 of FIG. 2A, and metal leads 207. Metal leads 207 are patterned on the glass substrate 209. Several metal leads 207 are placed, one metal lead 207 within the second recess 225, another metal lead from the second recess 225 to the first recess 223, and another metal lead 207 from the second recess 225 to top surface 221.

Figure 2C:
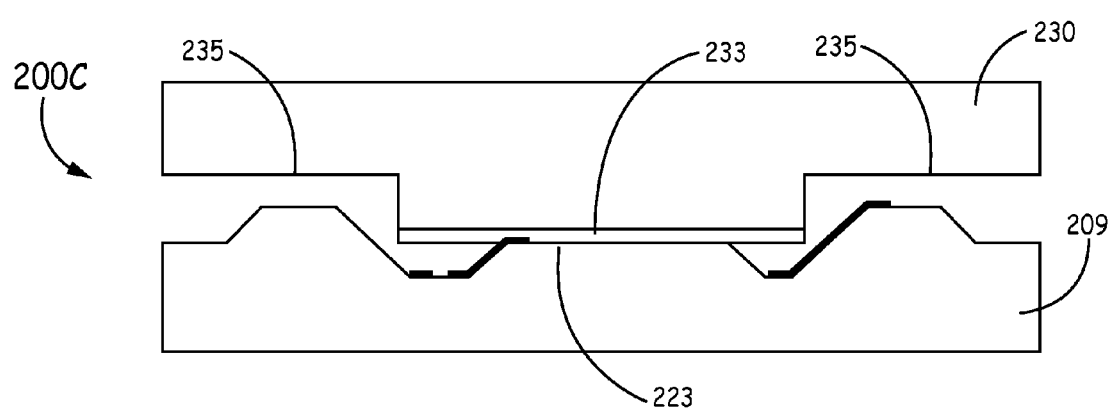
FIG. 2C illustrates one embodiment of a silicon wafer being bonded to a glass substrate as part of an exemplary manufacturing process for an all-silicon electrode capacitive transducer.

FIG. 2C illustrates a cross sectional view 200C of the glass substrate 209 with metal leads 207, and a first silicon wafer 230. Recesses 235 are etched into a first silicon wafer 230 having a doped epitaxial layer 233. The non-etched portion of the epitaxial silicon 233 is anodically bonded to the surface of the first recess 223 in the center of the glass substrate 209. The un-doped portion of the first silicon wafer 230 is then removed through a wet etching process in an etchant that selectively etches un-doped silicon without etching the highly doped silicon 233. The remaining portion of the epitaxial silicon 233 forms stationary silicon electrode 205.

Figure 2D:
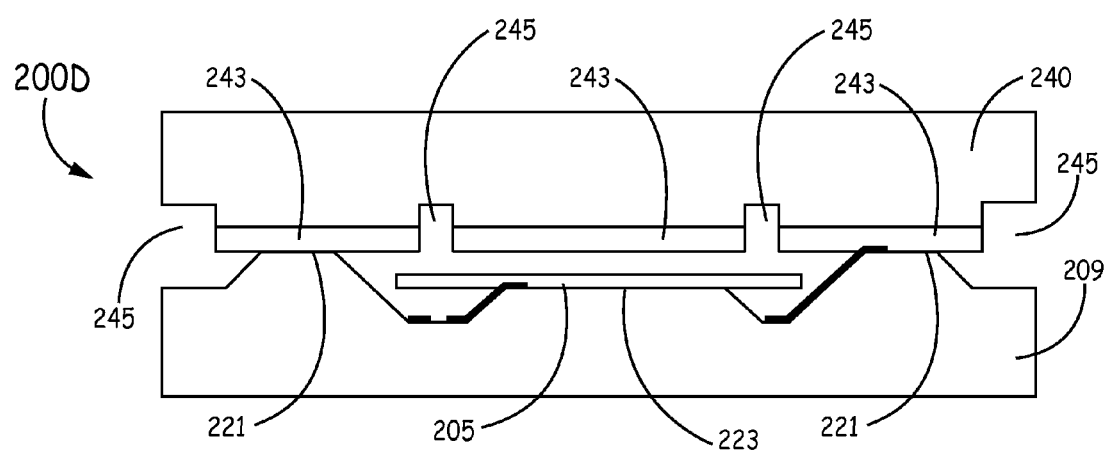
FIG. 2D illustrates one embodiment of a silicon wafer being bonded to a glass substrate as part of an exemplary manufacturing process for an all-silicon electrode capacitive transducer.

FIG. 2D illustrates a cross sectional view 200D of the glass substrate 209 with metal leads 207, stationary silicon electrode 205, and second silicon wafer 240. Recesses 245 are etched into second silicon wafer 240 having a doped epitaxial layer 243 to form the movable silicon microstructure 203. The second silicon wafer 240 also forms the anchored silicon 201. The second silicon wafer 240 is bonded to the top surface 221 of the glass substrate 209. The un-doped portion of the second silicon wafer 240 is removed by wet etching in an etchant that selectively etches un-doped silicon without etching the highly doped silicon 243.

In one embodiment, the stationary silicon electrode 205 is an electrode plate, having a flat surface that is parallel to the surface of the first recess 223. The surface of the first recess 223 is parallel to a plane formed by the top surface of the glass substrate 221, and positioned beneath movable silicon electrode 204. Movable silicon electrode 204 is also a flat plate-like structure having a flat surface parallel to the flat surface of the stationary silicon electrode 205, such that the flat surface of the movable silicon electrode 204 and stationary silicon electrode 205 are facing each other. In other embodiments, movable silicon electrode 204 is an interdigitated comb with comb fingers attached to anchored silicon 201. As will be appreciated by a person having skilled in the art, the movable silicon electrode 204 is not limited in form to the above described examples and can take the form of almost any shape that could be patterned into the doped epitaxial layer 243.

Figure 2E:
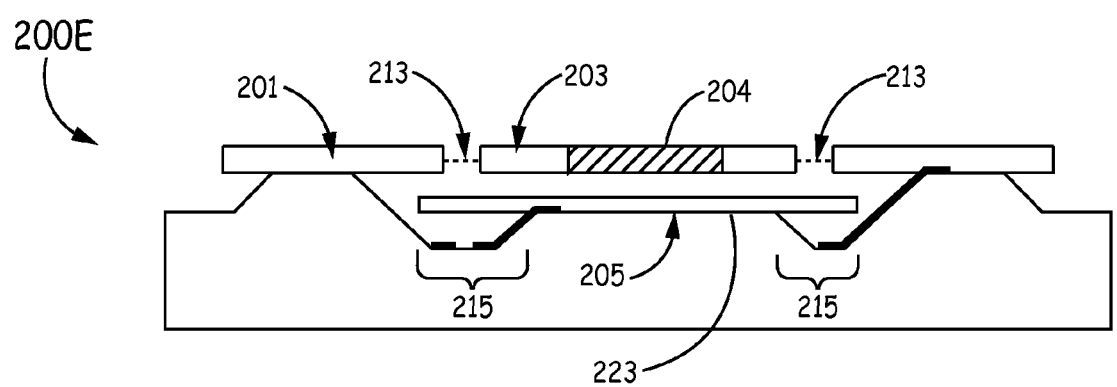
FIG. 2E illustrates one embodiment of a silicon electrode and movable silicon microstructure bonded to a glass substrate as part of an exemplary manufacturing process for an all-silicon electrode capacitive transducer.

FIG. 2E illustrates a cross sectional view 200E of the glass substrate 209 with metal leads 207, stationary silicon electrode 205, and movable silicon microstructure 203. Here, the un-doped portion of the second silicon wafer 240 is removed, the remaining doped portion of the second silicon wafer 240 comprising movable silicon microstructure 203, anchored silicon 201, and flexible silicon suspensions 213. Movable silicon microstructure 203 comprises movable silicon electrode 204 with anchored silicon 201 holding movable silicon microstructure 203 in place via flexible silicon suspensions 213. Stationary silicon electrode 205 has overhangs 215 that extend beyond the first recess 223. The overhang 215 is configured to shield movable silicon electrode 204 from stray charges on the surface of the glass substrate 209, and AC and DC applied voltages or CPD between the movable silicon electrode 204 and metal leads 207.

Figure 2F:
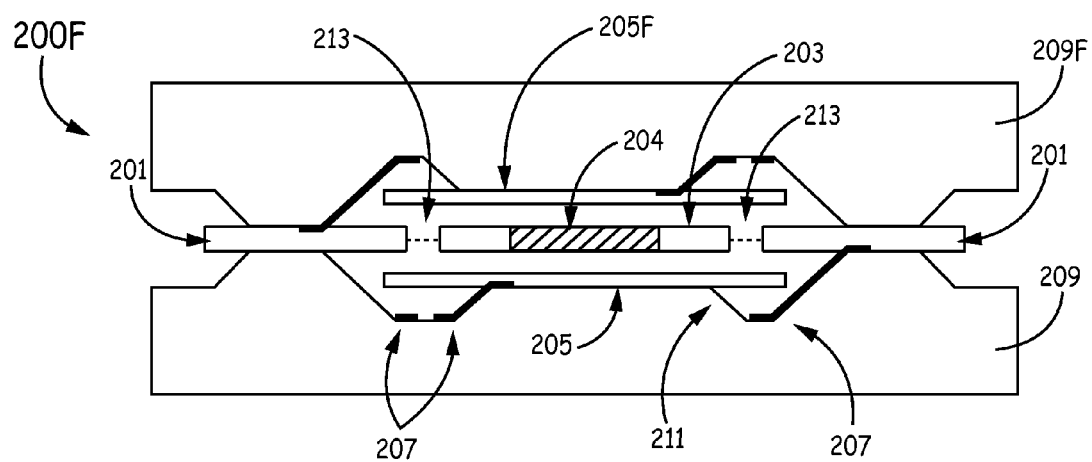
FIG. 2F illustrates an alternative embodiment of an all-silicon electrode capacitive transducer as an optional part of an exemplary manufacturing process for an all-silicon electrode capacitive transducer.

FIG. 2F illustrates a cross sectional view 200F of the glass substrate 209 with metal leads 207, stationary silicon electrode 205, and movable silicon microstructure 203 described in FIGS. 2A-2E with an additional glass substrate 209F above the movable silicon microstructure 203. The additional glass substrate 209F comprises two recesses, stationary silicon electrode 205F, and metal electrical leads like glass substrate 209. Anchor silicon 201 is bonded to the top surface of additional glass substrate 209F, such that movable silicon microstructure 203 is positioned between stationary silicon electrodes 205 and 205F.

Stationary silicon electrodes 205 and 205F are bonded to respective glass substrates 209 and 209F. Anchored silicon 201 is bonded to the top surfaces 221 of each of glass substrates 209 and 209F. Movable silicon microstructure 203 is coupled to anchored silicon 201 via flexible silicon suspensions 213. Movable silicon microstructure 203 includes movable silicon electrode 204. Movable silicon electrode 204 is configured between stationary silicon electrodes 205 and 205F such that stationary silicon electrodes 205 and 205F electrically shield movable silicon electrode 204 from unwanted CPD between the movable silicon electrode 204 and metal electrical leads 207, and from stray electrical charges on the respective surfaces of each of the glass substrates 209 and 209F.

Figure 2G:
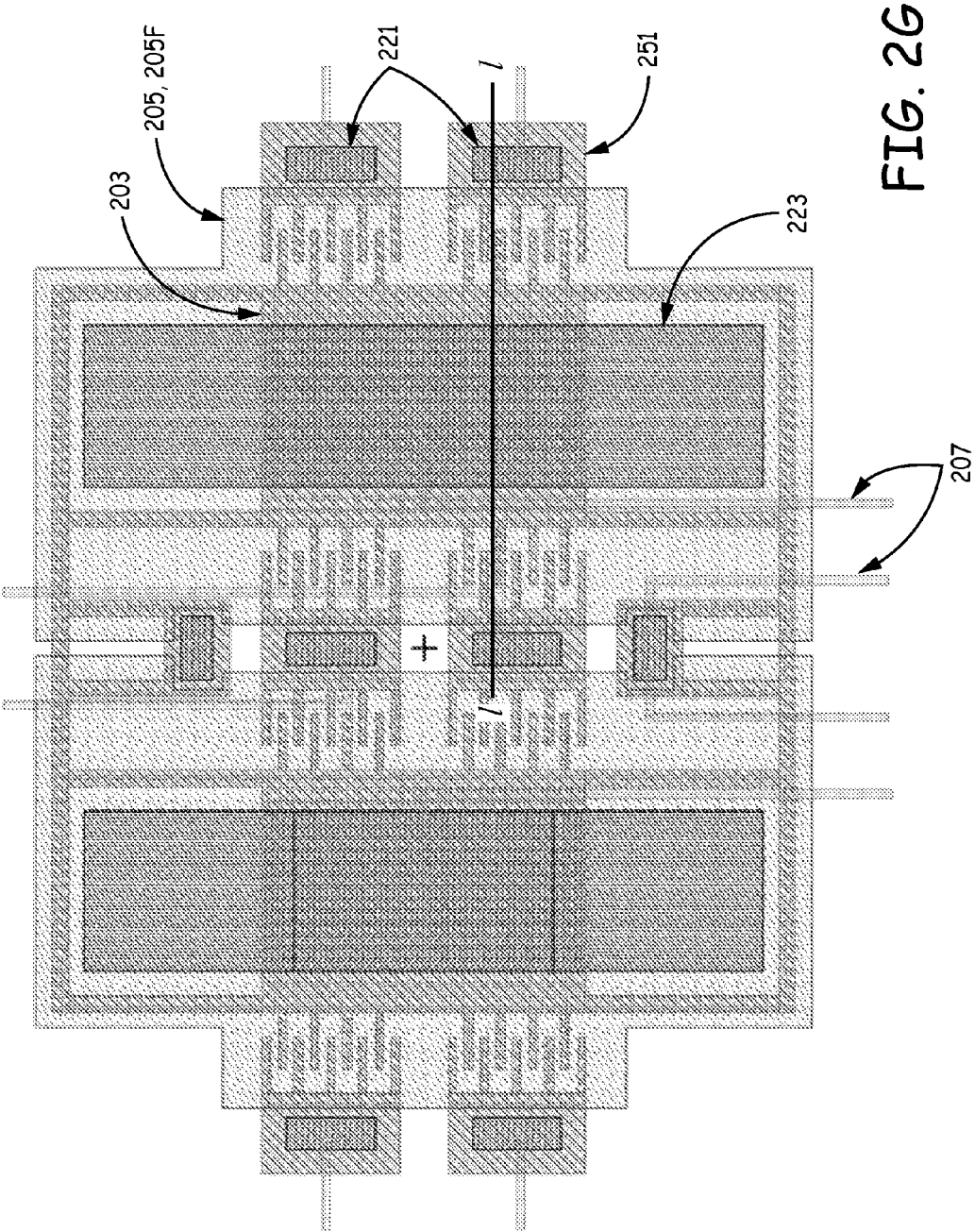
FIG. 2G illustrates one embodiment of an all-silicon electrode capacitive transducer in a horizontal (in-plane) configuration.

In one embodiment, the movable silicon microstructure 203 is part of a horizontal transducer (movement parallel to the plane of the surface of the substrate). FIG. 2G depicts a top down view of such an in-plane MEMS gyroscope 200G. Cross section line 1-1 shows the location of the cross sections depicted in FIGS. 2A-2F. In operation, stationary silicon electrodes 205 and 205F would be placed above and below movable silicon microstructure 203. Using silicon electrodes 205 and 205F on either side of the silicon microstructure 203 shields the horizontal transducer and can mitigate potential CPD, thus mitigating undesired vertical forces and induced charges that can be caused by the CPD. Actuating electrodes 251 are interdigitated combs and are configured to have an applied voltage that produces a horizontal force, causing movable silicon microstructure 203 to move horizontally; that is, parallel to the plane of the substrate. When there is rotational movement about and axis parallel to the plane of the substrate, the resulting Coriolis force on the movable silicon microstructure 203 causes it to move vertically. Stationary silicon electrodes 205 and 205F are configured to sense this vertical motion. Stationary silicon electrodes 205 and 205F are also configured to shield the movable silicon microstructure 203 from vertical forces and induced charges caused by CPD and vertical motion of the movable silicon electrode 203. As this is a top view, 205 and 205F are shown overlapping. Thus, the in-plane MEMS gyro 200G has both a horizontal and vertical transducer.

Figure 3A:
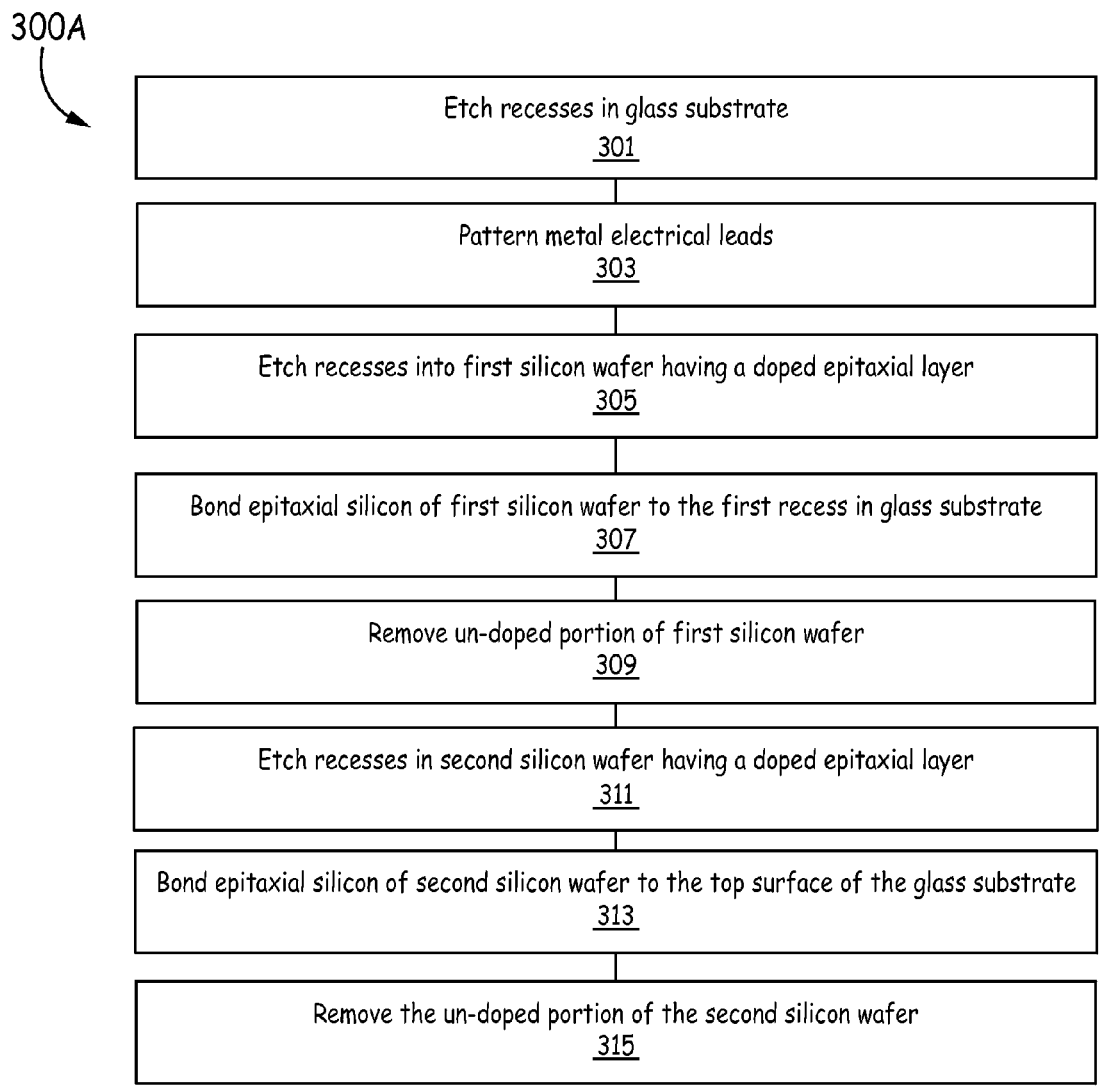
FIG. 3A illustrates a block diagram illustrating one embodiment of an exemplary method of manufacture for an all-silicon electrode capacitive transducer.

FIG. 3A illustrates a block diagram for a method 300A of manufacturing an all-silicon electrode capacitive transducer on a glass substrate. At block 301, recesses are etched into a glass substrate. In one embodiment, only one recess is etched into the glass substrate. In another embodiment, the glass substrate is patterned by photolithography and etching processes to form first recesses and second recesses, the first recesses deeper than a top surface of the glass substrate, and a second recesses deeper than the first recesses. Typically the recesses are 2 to 10 microns deep. At block 303, metal electrical leads are patterned onto the glass substrate. The metal electrical leads are placed such that they carry an electrical signal from a stationary silicon electrode and also a silicon electrode in the anchored silicon. At block 305, recesses are etched into a first silicon wafer having a doped epitaxial layer. To form a stationary silicon electrode, the first silicon wafer having a highly doped epitaxial surface layer is patterned and etched to form recesses deeper than the first recess on the glass substrate. Preferably, the highly doped epitaxial layer is thinner than the depth of the first recess in the glass substrate. Typically, the thickness of the epitaxial layer would be in the range of 0.5 to 10 microns.

At block 307, the epitaxial silicon is bonded to the surface of the first recess in the glass substrate. The non-etched portion of the highly doped epitaxial layer is anodically bonded to the surface of the first recess in the glass substrate. At block 309, the un-doped portion of the first silicon wafer is removed. The un-doped portion of the silicon wafer is removed by wet etching in an etchant that selectively etches the un-doped silicon without etching the highly doped silicon. One such etchant is an aqueous solution of ethylene diamine and pyrocatechol (EDP). The remaining highly doped silicon forms a stationary silicon electrode on the first recess in the glass substrate. At block 311, recesses are etched in a second silicon wafer having a doped epitaxial layer. To form the movable silicon microstructure, and movable silicon electrode, a second silicon wafer with a highly doped epitaxial surface layer is patterned and etched. The second silicon wafer also forms the anchored silicon structure. At block 313, the second silicon wafer is bonded to the top surface of the glass substrate. At block 315, the un-doped portion of the second silicon wafer is removed by wet etching in an etchant that selectively etches un-doped silicon without etching the highly doped silicon.

Figure 3B:
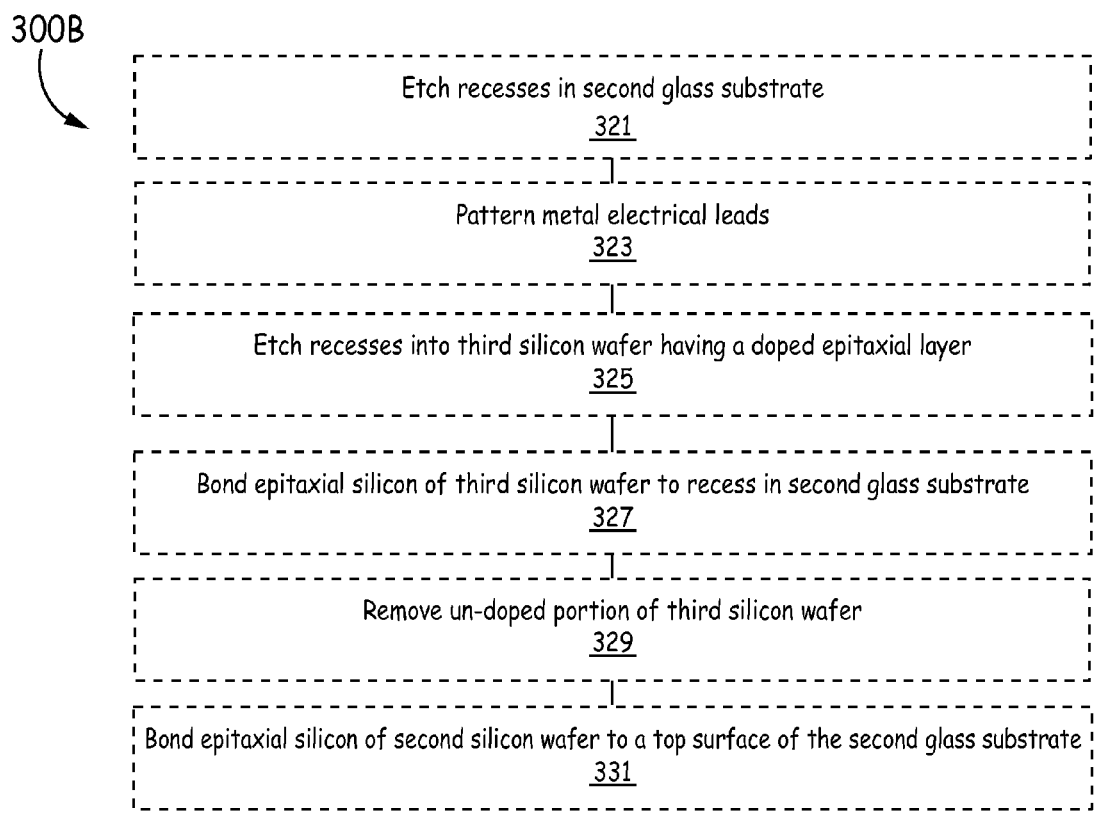
FIG. 3B illustrates a block diagram illustrating optional steps in a method of manufacture for an all-silicon electrode capacitive transducer.

FIG. 3B illustrates optional steps in an exemplary method of manufacturing an all-silicon electrode capacitive transducer, and is described here with reference to FIG. 3A. At optional block 321, recesses are etched into a second glass substrate. As described above with respect to the previous glass substrate, one or more recesses may be etched into the second glass substrate. At optional block 323, metal electrical leads are patterned onto the second glass substrate. At optional block 325, recesses are etched into a third silicon wafer having a doped epitaxial layer. To form a stationary silicon electrode, the third silicon wafer having a highly doped epitaxial surface layer is patterned and etched as described above in relation to the first silicon wafer. At optional block 327, the third silicon wafer is then bonded to the recess in the second glass substrate, as described above in relation to the first silicon wafer. At optional block 329, the undoped portion of the third silicon wafer is removed, as described above in relation to the first silicon wafer. At optional block 331, the second glass substrate is anodically bonded to the highly doped epitaxial silicon of the second silicon wafer. This creates stationary silicon electrodes both above and below the movable silicon microstructure. This provides greater symmetry for sensing and actuation of the movable silicon microstructure. Applications of such an embodiment include, but are not limited to, out-of-plane MEMS gyroscopes (OPG), in-plane MEMS gyroscopes (IPG), out-of-plane MEMS accelerometers (OPA), and in-plane MEMS accelerometers (IPA).

It is to be understood that FIGS. 3A and 3B depict exemplary embodiments and that it is not necessary to perform the method in the order in which the blocks are presented. Therefore, FIGS. 3A and 3B, and the above description are not to be taken in a limiting sense.

Figure 4:
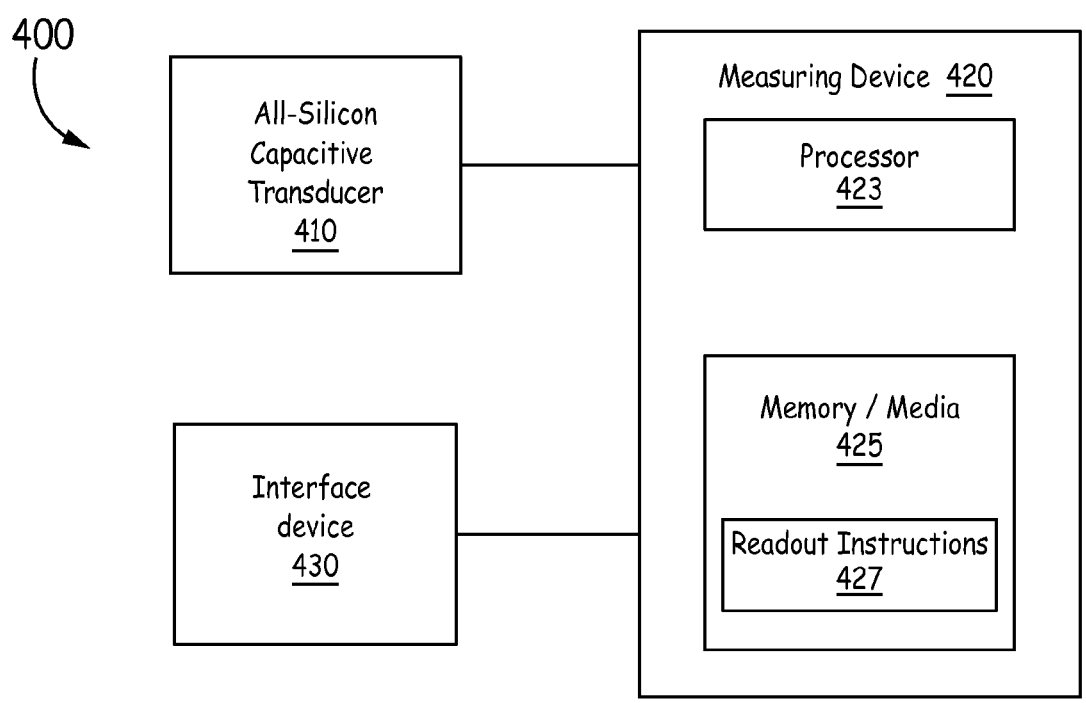
FIG. 4 illustrates one embodiment of an exemplary system for an all-silicon electrode capacitive transducer.

FIG. 4 is a system block diagram illustrating an exemplary system 400 for an all-silicon electrode capacitive transducer. In one embodiment, all-silicon electrode capacitive transducer 410 is coupled to measurement unit 420. Measurement unit 420 comprises a processor 423 coupled to computer readable memory/media 425, containing readout instructions 427. Suitable computer readable memory includes any available media that can be accessed by a general purpose or special purpose computer or processor, or any programmable logic device. For example, suitable processor-readable media may include storage or memory media such as, but not limited to, conventional hard disks, Compact Disk-Read Only Memory (CD-ROM), volatile or non-volatile media such as Random Access Memory (RAM) (including, but not limited to, Synchronous Dynamic Random Access Memory (SDRAM), Double Data Rate (DDR) RAM, RAMBUS Dynamic RAM (RDRAM), Static RAM (SRAM), etc.), Read Only Memory (ROM), Electrically Erasable Programmable ROM (EEPROM), and flash memory, etc.

In one embodiment, all-silicon electrode capacitive transducer 410 can be implemented as one of the embodiments described above in FIGS. 1 and 2A-F.

As stated above, measurement unit 420 comprises processor 423 coupled to system memory and/or media 425, which includes readout instructions 427 configured to cause processor 423 to read a signal from the all-silicon electrode capacitive transducer 410 indicating movement and/or attitude of the all-silicon electrode capacitive transducer. Processor 423 is coupled to interface device 430. The processor is configured to cause the interface device 430 to visually, aurally, or otherwise indicate a result indicative of the transducer signal, such as acceleration, rotation, pressure, etc. In one embodiment, interface device 430 is a display that is capable of displaying graphical content. Suitable exemplary displays include, but are not limited to, a display associated with an aircraft inertial navigation system. Suitable technologies for implementing the display include, but are not limited to, a cathode ray tube (CRT) display, an active matrix liquid crystal display (LCD), a passive matrix LCD, a light emitting diode display (LED), or plasma display unit. In other embodiments, the interface device 430 is a speaker capable of aurally indicating a signal of the transducer 410.

Although specific embodiments have been illustrated and described herein, it will be appreciated by those of ordinary skill in the art that any arrangement, which can achieve the same purpose, may be substituted for the specific embodiments shown. Therefore, it is manifestly intended that this invention be limited only by the claims and the equivalents thereof.

EXAMPLE EMBODIMENTS

Example 1 is an all-silicon electrode capacitive transducer comprising: a movable silicon microstructure coupled to a glass substrate, the movable silicon microstructure having a movable silicon electrode, the glass substrate having a top surface and at least one recess, the movable silicon electrode having a first flat surface parallel to a plane of the top surface of the glass substrate, the movable silicon electrode having a first electronic work function; and a stationary silicon electrode coupled to a glass substrate, the stationary silicon electrode adjacent to the movable silicon electrode, the stationary silicon electrode configured to sense or actuate displacement of the movable silicon microstructure, wherein the stationary silicon electrode has a second flat surface parallel to the first flat surface, the stationary silicon electrode having a second electronic work function equal to the first electronic work function.

Example 2 includes the capacitive transducer of example 2, wherein the movable silicon microstructure is coupled to the glass substrate through silicon anchors, wherein the silicon anchors are bonded to the top surface of the glass substrate, wherein the movable silicon microstructure is coupled to the silicon anchors by flexible silicon suspensions.

Example 3 includes the capacitive transducer of any of examples 1 or 2, wherein the glass substrate has a first recess and a second recess, the first recess located below a top surface of the glass substrate, the second recess deeper than the first, wherein the stationary silicon electrode is coupled to the first recess, wherein the movable silicon microstructure is coupled to the top surface of the glass substrate.

Example 4 includes the capacitive transducer of any of examples 1-3, wherein the stationary silicon electrode has an overhang, wherein the overhang is a part of the stationary silicon electrode that extends beyond the surface of the first recess, wherein the overhang extends over the second recess such that the overhang shields the movable silicon microstructure from electric field lines from a surface of the second recess.

Example 5 includes the capacitive transducer of any of examples 1-4 wherein the stationary silicon electrode and movable silicon electrode are highly doped epitaxial silicon electrodes, wherein the electrical work function of the stationary silicon electrode and movable silicon electrode are matched to mitigate a contact potential difference between the stationary silicon electrode and movable silicon electrode.

Example 6 includes the capacitive transducer of any of examples 1-5, wherein the capacitive transducer is a horizontal capacitive transducer configured to sense or to actuate horizontal motion of the movable silicon electrode, wherein the stationary silicon electrode is configured to electrically shield the movable silicon electrode, prevent vertical forces in the horizontal transducer, and prevent induced charges caused by vertical motion of the movable silicon electrode.

Example 7 includes the capacitive transducer of any of examples 1-5, wherein the capacitive transducer is a vertical capacitive transducer configured to sense or to actuate vertical motion of the movable silicon electrode, wherein the stationary silicon electrode is further configure to electrically shield the movable silicon electrode.

Example 8 includes the capacitive transducer of any of examples 1-7 having more than one stationary silicon electrode attached to glass substrates above and below the movable silicon microstructure, the more than one stationary silicon electrode configured to electrically shield the movable silicon electrode from above and below the movable silicon microstructure respectively.

Example 9 is a method of manufacturing an all-silicon electrode capacitive transducer comprising: etching at least one recess into a glass substrate; patterning metal electrical leads onto the glass substrate; etching recesses into a first silicon wafer having a doped epitaxial layer; bonding epitaxial silicon of the first silicon wafer to a first recess of the at least one recess of the glass substrate; removing an un-doped portion of the first silicon wafer, wherein a remaining portion of the first silicon wafer comprises a stationary silicon electrode; etching recesses in a second silicon wafer having a doped epitaxial layer; bonding epitaxial silicon of the second silicon wafer to a top surface of the glass substrate; removing an un-doped portion of the second silicon wafer, wherein a remaining portion of the second silicon wafer comprises a movable silicon microstructure, the movable silicon microstructure having a movable silicon electrode.

Example 10 includes the method of example 9, wherein a first recess and a second recess are etched into the glass substrate, the first recess located below a top surface of the glass substrate, the second recess deeper than the first recess, wherein the stationary silicon electrode is coupled to the first recess.

Example 11 includes the method of any of examples 9-10, wherein the stationary silicon electrode has an overhang, wherein the overhang is a part of the stationary silicon electrode that extends beyond a surface of the first recess, wherein the overhang extends over the second recess such that the overhang shields the movable silicon microstructure from charges on a surface of the second recess.

Example 12 includes the method of any of examples 9-11 comprising: etching at least one recess into a second glass substrate; patterning metal electrical leads onto the second glass substrate; etching recesses into a third silicon wafer having a doped epitaxial layer; bonding epitaxial silicon of the third silicon wafer to a third recess of the at least one recess of the second glass substrate; removing an un-doped portion of the third silicon wafer, wherein a remaining portion of the third silicon wafer comprises a second stationary silicon electrode; bonding epitaxial silicon of the second silicon wafer to a top surface of a second glass substrate.

Example 13 includes the method of example 12, wherein a first recess and a second recess are etched into the glass substrate, the first recess located below a top surface of the glass substrate, the second recess deeper than the first recess, wherein the stationary silicon electrode is coupled to the first recess, wherein a third recess and a fourth recess are etched into the second glass substrate, the third recess located below a top surface of the second glass substrate, the fourth recess deeper than the third recess, wherein the second stationary silicon electrode is coupled to the third recess.

Example 14 includes the method of example 12, wherein: the stationary silicon electrode has an overhang, wherein the overhang is a part of the stationary silicon electrode that extends beyond a surface of the first recess, wherein the overhang extends over the second recess such that the overhang shields the movable silicon microstructure from charges on a surface of the second recess; the second stationary silicon electrode has an overhang, wherein the overhang is a part of the second stationary silicon electrode that extends beyond a surface of the third recess, wherein the overhang extends over the fourth recess such that the overhang shields the movable silicon microstructure from charges on a surface of the fourth recess.

Example 15 is a system for an all-silicon electrode capacitive transducer comprising: an all-silicon electrode capacitive transducer comprising: a movable silicon microstructure coupled to a glass substrate, the movable silicon microstructure having a movable silicon electrode, the glass substrate having a top surface and at least one recess, the movable silicon electrode having a first flat surface parallel to a plane of the top surface of the glass substrate, the movable silicon electrode having a first electronic work function; stationary silicon electrode coupled to a glass substrate, the stationary silicon electrode adjacent to the movable silicon electrode, the stationary silicon electrode configured to sense or actuate displacement of the movable silicon microstructure, wherein the stationary silicon electrode has a second flat surface parallel to the first flat surface, the stationary silicon electrode having a second electronic work function equal to the first electronic work function; a measurement unit coupled to the all-silicon electrode capacitive transducer, the measurement unit configured to read a signal from the all-silicon electrode capacitive transducer; and an interface device coupled to the measurement unit configured to indicate a result indicative of the signal from the all-silicon electrode capacitive transducer.

Example 16 includes the system of example 15, wherein the glass substrate has a first recess and a second recess, the first recess located below a top surface of the glass substrate, the second recess deeper than the first, wherein the stationary silicon electrode is coupled to the first recess, wherein the movable silicon microstructure is coupled to the top surface of the glass substrate.

Example 17 includes the system of any of examples 15-16 wherein the stationary silicon electrode has an overhang, wherein the overhang is a part of the stationary silicon electrode that extends beyond the surface of the first recess, wherein the overhang extends over the second recess such that the overhang shields the movable silicon microstructure from electric field lines from a surface of the second recess Example 18 includes the system of any of examples 15-17 wherein the stationary silicon electrode and movable silicon electrode are highly doped epitaxial silicon electrodes, wherein the electrical work function of the stationary silicon electrode and movable silicon electrode are matched to mitigate a contact potential difference between the stationary silicon electrode and movable silicon electrode Example 19 includes the system of any of examples 15-18, wherein the all-silicon electrode capacitive transducer has more than one stationary silicon electrode attached to glass substrates above and below the movable silicon microstructure, the more than one stationary silicon electrode configured to electrically shield the movable silicon electrode from above and below Example 20 includes the system of example 19, wherein the more than one stationary silicon electrodes have respective overhangs, wherein each overhang is a part of a respective stationary silicon electrode that extends beyond a surface of the respective glass substrate to which the stationary silicon electrode is attached, wherein the overhang extends over a recess in the respective glass substrate such that the overhang shields the movable silicon microstructure from charges on a respective surface of the recess of each substrate.

What is claimed is:

1. A capacitive transducer comprising:
a movable silicon microstructure coupled to a glass substrate, the movable silicon microstructure having a movable silicon electrode, the glass substrate having a top surface with at least one recess that includes a first recess portion and a second recess portion, the first recess portion having a first depth extending from the movable silicon microstructure to a first surface in the first recess portion, the second recess portion having a second depth that is greater than the first depth, the second depth extending from the movable silicon electrode to a second surface in the second recess portion, the movable silicon electrode having a first flat surface parallel to a plane of the top surface of the glass substrate, the movable silicon electrode having a first electronic work function; and
a stationary silicon electrode bonded to the first surface in the first recess portion, the stationary silicon electrode located under the movable silicon electrode, the stationary silicon electrode configured to sense or actuate displacement of the movable silicon microstructure, wherein the stationary silicon electrode has a second flat surface parallel to the first flat surface, the stationary silicon electrode having a second electronic work function equal to the first electronic work function, the stationary silicon electrode having an overhang that extends beyond the first surface in the first recess portion such that the overhang is located between the second surface of the second recess portion and the movable silicon microstructure.

2. The capacitive transducer of claim 1, wherein the movable silicon microstructure is coupled to the glass substrate through silicon anchors, wherein the silicon anchors are bonded to the top surface of the glass substrate, wherein the movable silicon microstructure is coupled to the silicon anchors by flexible silicon suspensions.

3. The capacitive transducer of claim 1, wherein the overhang shields the movable silicon microstructure from electric field lines from at least one electrical lead on the second surface in the second recess portion.

4. The capacitive transducer of claim 1, wherein the stationary silicon electrode and movable silicon electrode are doped silicon electrodes, wherein the electrical work function of the stationary silicon electrode and movable silicon electrode are matched to mitigate a contact potential difference between the stationary silicon electrode and movable silicon electrode.

5. The capacitive transducer of claim 1, wherein the capacitive transducer is a horizontal capacitive transducer and further comprises an actuating electrode configured to actuate horizontal motion of the movable silicon electrode, wherein the stationary silicon electrode is configured to perform at least one of:
electrically shielding the movable silicon electrode from electric field lines from at least one electrical lead on the second surface in the second recess portion;
preventing vertical forces on the movable silicon microstructure since the second electronic work function is equal to the first electronic work function; and
preventing induced electric current caused by vertical motion of the movable silicon microstructure.

6. The capacitive transducer of claim 1, wherein the capacitive transducer is a vertical capacitive transducer configured to sense or to actuate vertical motion of the movable silicon electrode, wherein the stationary silicon electrode is further configured to electrically shield the movable silicon electrode from electric field lines from at least one electrical lead on the second surface in the second recess portion.

7. The capacitive transducer of claim 1, further comprising a second glass substrate above the movable silicon microstructure and coupled to the movable silicon microstructure, the second glass substrate having at least one recess that includes a third recess portion and a fourth recess portion, the third recess portion having a third depth extending from the movable silicon microstructure to a third surface in the third recess portion, the fourth recess portion having a fourth depth that is greater than the third depth, the fourth depth extending from the movable silicon electrode to a fourth surface in the fourth recess portion, and at least one stationary silicon electrode bonded to the third surface in the third recess portion, the at least one stationary silicon electrode bonded to the third surface configured to electrically shield the movable silicon electrode from electric field lines from at least one electrical lead on the fourth surface in the fourth recess portion.

8. A system for a capacitive transducer, comprising:
an all-silicon electrode capacitive transducer comprising:
a movable silicon microstructure coupled to a glass substrate, the movable silicon microstructure having a movable silicon electrode, the glass substrate having a top surface with at least one recess that includes a first recess portion and a second recess portion, the first recess portion having a first depth extending from the movable silicon microstructure to a first surface in the first recess portion, the second recess portion having a second depth that is greater than the first depth, the second depth extending from the movable silicon electrode to a second surface in the second recess portion, the movable silicon electrode having a first flat surface parallel to a plane of the top surface of the glass substrate, the movable silicon electrode having a first electronic work function; and
a stationary silicon electrode bonded to the first surface in the first recess portion, the stationary silicon electrode located under the movable silicon electrode, the stationary silicon electrode configured to sense or actuate displacement of the movable silicon microstructure, wherein the stationary silicon electrode has a second flat surface parallel to the first flat surface, the stationary silicon electrode having a second electronic work function equal to the first electronic work function, the stationary silicon electrode having a first overhang that extends beyond the first surface in the first recess portion such that the first overhang is located between the second surface of the second recess portion and the movable silicon microstructure;
a measurement unit coupled to the all-silicon electrode capacitive transducer, the measurement unit configured to read a signal from the all-silicon electrode capacitive transducer; and
an interface device coupled to the measurement unit and configured to indicate a result indicative of the signal from the all-silicon electrode capacitive transducer.

9. The system of claim 8, wherein the movable silicon microstructure is coupled to the top surface of the glass substrate.

10. The system of claim 9, wherein the first overhang shields the movable silicon microstructure from electric field lines from at least one electrical lead on the second surface in the second recess portion.

11. The system of claim 8, wherein the stationary silicon electrode and movable silicon electrode are doped silicon electrodes, wherein the electrical work function of the stationary silicon electrode and movable silicon electrode are matched to mitigate a contact potential difference between the stationary silicon electrode and movable silicon electrode.

12. The system of claim 8, further comprising a second glass substrate above the movable silicon microstructure and coupled to the movable silicon microstructure, the second glass substrate having at least one recess that includes a third recess portion and a fourth recess portion, the third recess portion having a third depth extending from the movable silicon microstructure to a third surface in the third recess portion, the fourth recess portion having a fourth depth that is greater than the third depth, the fourth depth extending from the movable silicon electrode to a fourth surface in the fourth recess portion, and at least one stationary silicon electrode bonded to the third surface in the third recess portion.

13. The system of claim 12, wherein the at least one stationary silicon electrode bonded to the third surface in the third recess portion has a second overhang that extends beyond the third surface in the third recess portion such that the second overhang is located between the fourth surface of the fourth recess portion and the movable silicon microstructure, the second overhang configured to electrically shield the movable silicon electrode from electric field lines from at least one electrical lead on the fourth surface in the fourth recess portion.

* * * * *